(12) United States Patent
Zeng et al.

(10) Patent No.: US 10,955,300 B2
(45) Date of Patent: Mar. 23, 2021

(54) NEGATIVE POISSON RATIO PIEZORESISTIVE SENSOR AND METHOD OF MANUFACTURE

(71) Applicant: The Florida State University Research Foundation, Inc., Tallahassee, FL (US)

(72) Inventors: Changchun Zeng, Tallahassee, FL (US); Zhiyong Liang, Tallahassee, FL (US); Yan Li, Tallahassee, FL (US); Sida Luo, Tallahassee, FL (US); Tao Liu, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 48 days.

(21) Appl. No.: 15/803,400

(22) Filed: Nov. 3, 2017

(65) Prior Publication Data

US 2018/0073943 A1    Mar. 15, 2018

Related U.S. Application Data

(63) Continuation of application No. PCT/US2016/030716, filed on May 4, 2016.

(60) Provisional application No. 62/156,609, filed on May 4, 2015.

(51) Int. Cl.
| | | |
|---|---|---|
| *G01L 1/18* | (2006.01) | |
| *B29C 44/34* | (2006.01) | |
| *B82Y 40/00* | (2011.01) | |
| *G01L 1/22* | (2006.01) | |
| *G01L 1/26* | (2006.01) | |
| *G01R 29/22* | (2006.01) | |

(52) U.S. Cl.
CPC .............. *G01L 1/18* (2013.01); *B29C 44/357* (2013.01); *B82Y 40/00* (2013.01); *G01L 1/2287* (2013.01); *G01L 1/26* (2013.01); *G01R 29/22* (2013.01)

(58) Field of Classification Search
CPC .................................................. B29C 44/357
See application file for complete search history.

(56) References Cited

U.S. PATENT DOCUMENTS

| | | |
|---|---|---|
| 2004/0132070 A1 | 7/2004 | Star et al. |
| 2008/0076837 A1 | 3/2008 | Kuper et al. |
| 2011/0059291 A1* | 3/2011 | Boyce .................. C08J 5/00 428/136 |

(Continued)

OTHER PUBLICATIONS

Nanotube Superfiber Materials, Chapter 24, Elsevier http://dx.doi.org/10.1016/B978-1-4557-7863-8.00024-4, pp. 671 and 684, 2014 (Year: 2014).*

(Continued)

*Primary Examiner* — Alexandre F Ferre
(74) *Attorney, Agent, or Firm* — Meunier Carlin & Curfman LLC

(57) ABSTRACT

The present invention includes scalable and cost-effective auxetic foam sensors (AFS) created through conformably coating a thin conductive nanomaterial-sensing layer on a porous substrate having a negative Poisson's ratio. In general, the auxetic foam sensors possess multimodal sensing capability, such as large deformation sensing, small pressure sensing, shear/torsion sensing and vibration sensing and excellent robustness in humidity environment.

13 Claims, 10 Drawing Sheets

(56) References Cited

U.S. PATENT DOCUMENTS

| | | |
|---|---|---|
| 2011/0236769 A1 | 9/2011 | Xie et al. |
| 2013/0079693 A1 | 3/2013 | Ranky et al. |
| 2013/0082970 A1 | 4/2013 | Frey et al. |
| 2013/0134992 A1 | 5/2013 | Zhu et al. |
| 2013/0197319 A1 | 8/2013 | Monty et al. |
| 2013/0218050 A1 | 8/2013 | Eichhorn et al. |
| 2013/0345610 A1 | 12/2013 | Larson et al. |

OTHER PUBLICATIONS

International Search Report and Written Opinion for PCT/US2016/030716 (filing date: May 4, 2016) dated Aug. 8, 2016; Applicant: The Florida State University Research Foundation, Inc.

International Preliminary Report on Patentability for PCT/US2016/030716 (filing date: May 4, 2016) dated May 4, 2015; Applicant: The Florida State University Research Foundation, Inc.

Grow et al., Piezoresistance of carbon nanotubes on deformable thin-film membranes. Applied Physics Letters. 2005. vol. 86: 093104.

Hwang et al., Poly(3-hexylthiophene) wrapped carbon nanotube/poly(dimethylsiloxane) composites for use in finger-sensing piezoresistive pressure sensors. Carbon. 2011. vol. 49: 106-110.

Bsoul et al., Piezoresistive pressure sensor using vertically aligned carbon-nanotube forests. Electronics Letters. 2011. vol. 47 (No. 14): 807-808.

Hou et al., Positive piezoresistive behavior of electrically conductive alkyl-functionalized graphene/polydimethylsilicone nanocomposites. Journal of Materials Chemistry C. 2013. vol. 1: 515-521.

\* cited by examiner

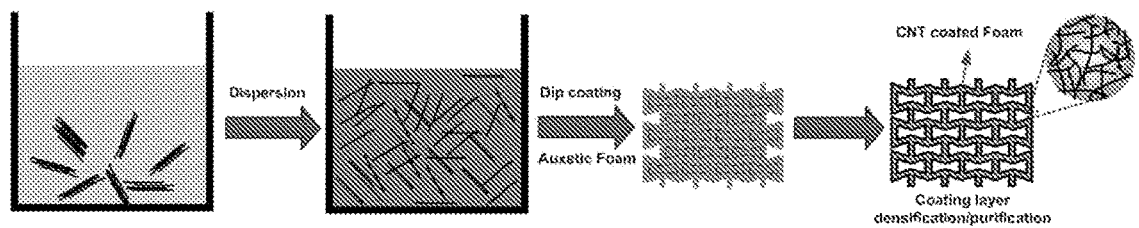
FIG. 1
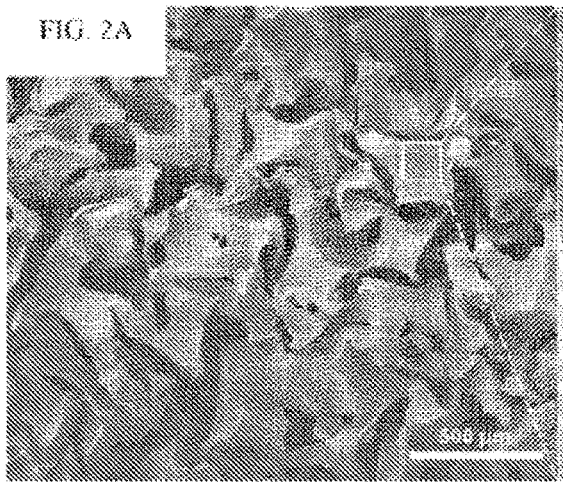
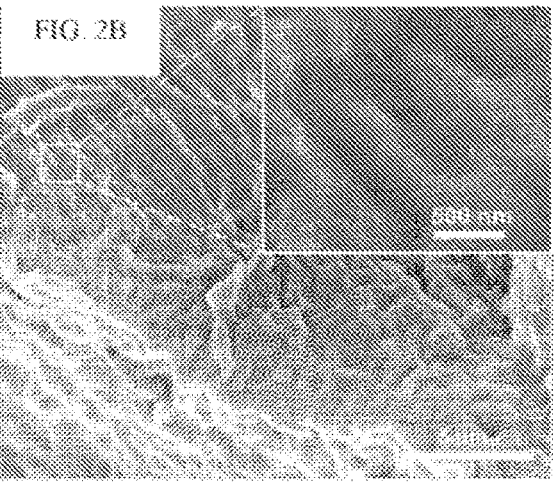

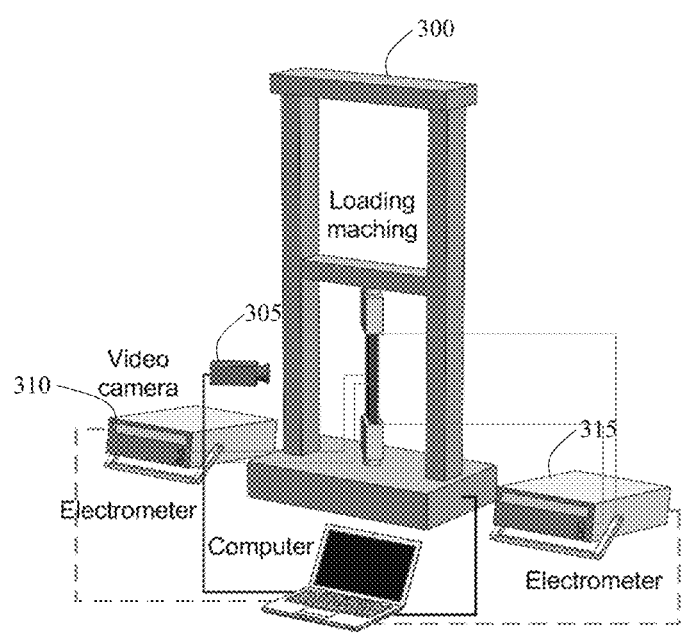 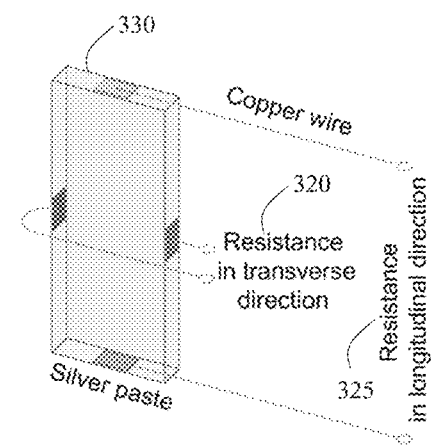
FIG. 3A                    FIG. 3B

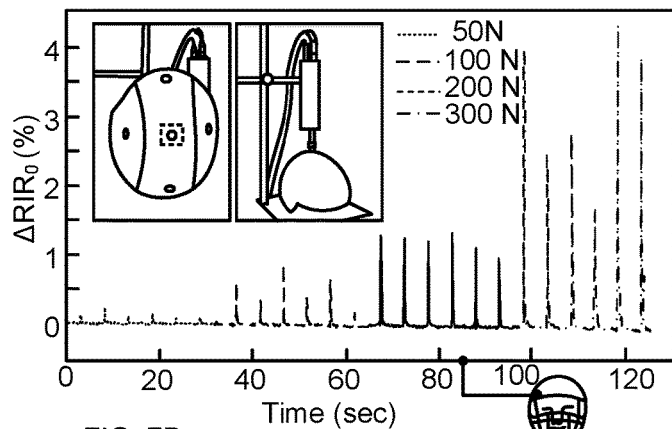
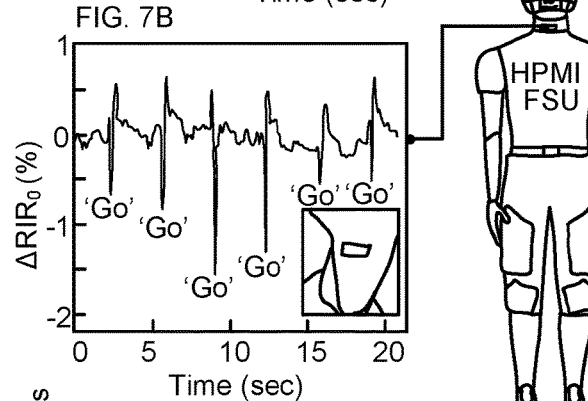
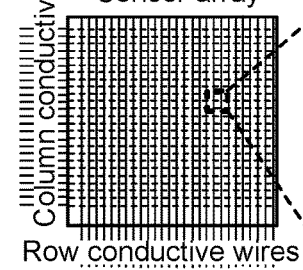
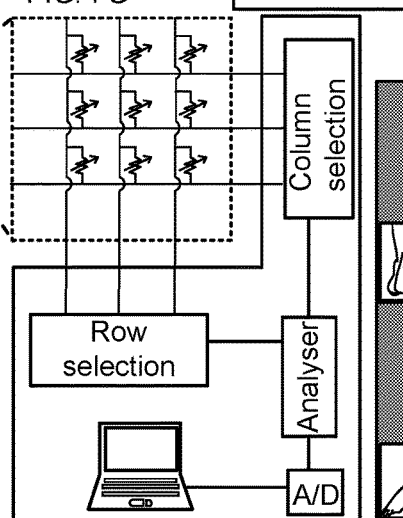
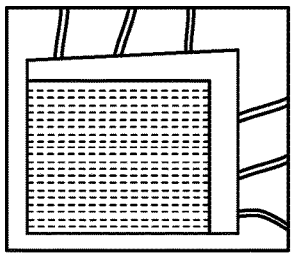
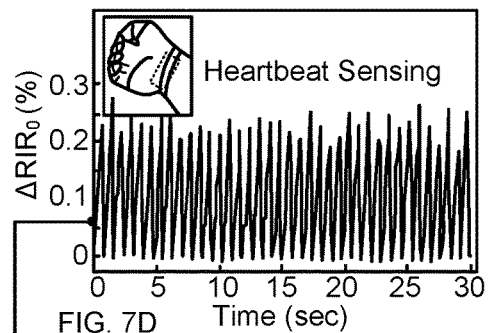
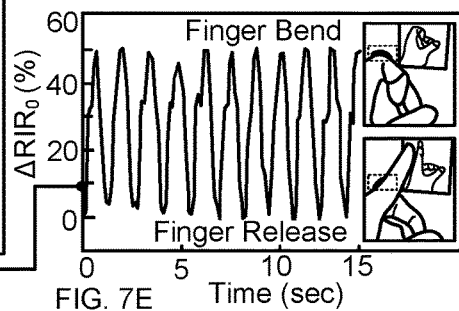
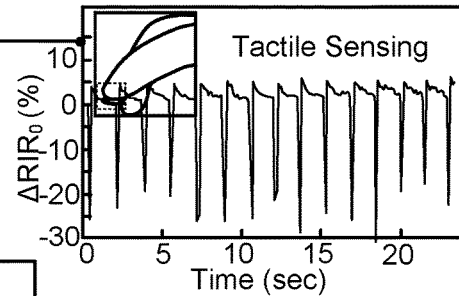
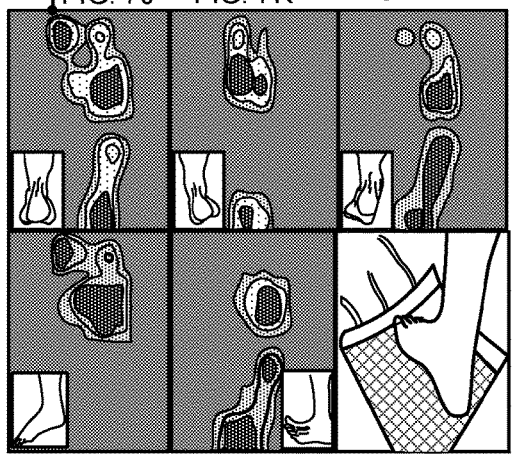

NEGATIVE POISSON RATIO PIEZORESISTIVE SENSOR AND METHOD OF MANUFACTURE

CROSS-REFERENCE TO RELATED APPLICATIONS

This application is a continuation of and claims priority to International Patent Application No. PCT/US2016/030716, entitled "NEGATIVE POISSON RATIO PIEZORESISTIVE SENSOR AND METHOD OF MANUFACTURE", filed May 4, 2016 by the same inventors, which claims priority to U.S. Provisional Patent Application No. 62/156,609, entitled "Lightweight Sensor Materials Systems and Their Method of Manufacturing", having a filing date of May 4, 2015, the entirety of which is hereby incorporated by reference.

BACKGROUND OF THE INVENTION

Flexible, stretchable, highly sensitive and low-cost pressure sensors are key elements in advancing wearable or implantable measuring devices. Over the last decade, the pursuit of such sensors has become a rapidly expanded area of research that covers electronics, chemistry, physics, mechanics and materials science, and has enabled a wide variety of new ideas in sensor design based on different sensing mechanisms, such as transistor, triboelectric, capacitive, piezoelectric, and piezoresistive properties.

Piezoresistive pressure sensors, which transform an input force into an electrical signal caused by the change in the resistance, have attracted considerable attention by virtue of their simplicity and low cost in design and implementation. Flexible piezoresistive sensors currently known in the art are prepared by loading conductive nanomaterials, such as carbon nanotubes, graphene, nanowires and nanoparticles, onto flexible substrates, such as fibers, films and open-cell foams, via a number of processing methods, such as blending, coating, and printing. Among the different conductive nanomaterials, carbon nanotubes have attracted a considerable amount of attention due to their remarkably high piezoresistive sensitivity.

It has been shown that the performance of flexible and stretchable sensors relies on the optimization of both the flexible substrate and the sensing element, and their synergistic interactions.

Accordingly, what is needed in the art is a flexible piezoresistive sensor that exhibits improved piezoresistive sensitivity over other conventional flexible sensors currently known in the art.

SUMMARY OF THE INVENTION

The present invention provides a flexible piezoresistive sensor that exhibits improved piezoresistive sensitivity over other conventional flexible sensors currently known in the art.

In one embodiment, the sensor of the present invention includes, a porous substrate having a negative Poisson ratio and a piezoresistive layer covering at least a portion of the porous substrate. The porous substrate may be an auxetic material, and in a particular embodiment, the porous substrate is auxetic foam and the Poisson ratio of the substrate may be about −0.5.

The piezoresistive layer may include a conductive nanomaterial, and in particular may include carbon nanotubes. The piezoresistive layer may be dip-coated onto the porous substrate to be about wt 1% of the sensor.

In an additional embodiment, a wearable device may be provided including a sensor and the sensor further including, a porous substrate having a negative Poisson ratio and a piezoresistive layer covering at least a portion of the substrate. The wearable device may be selected from a head protection device, a bio-sensing device, a gesture sensing device, a tactile sensing device and a pressure sensing device.

A method of manufacturing the sensor of the present invention may include, providing a porous substrate comprising a negative Poisson ratio and forming a piezoresistive layer covering at least a portion of the porous substrate. Forming the piezoresistive layer covering at least a portion of the porous substrate may further include, forming an aqueous dispersion of conductive nanomaterial and dip-coating the aqueous dispersion of conductive nanomaterial onto the porous substrate. The aqueous dispersion may further include a suspension comprising conductive nonmaterial, deionized water and nonionic surfactant sonicated to form the aqueous dispersion of conductive nanomaterial. In one embodiment, the conductive nanomaterial comprises carbon nanotubes and the porous substrate is auxetic foam.

The auxetic foam sensors in accordance with the present invention possess multimodal sensing capability, such as large deformation sensing, small pressure sensing, shear/torsion sensing and vibration sensing and excellent robustness in humidity environment, thereby exhibiting improved piezoresistive sensitivity over other conventional flexible sensors currently known in the art.

BRIEF DESCRIPTION OF THE DRAWINGS

For a fuller understanding of the invention, reference should be made to the following detailed description, taken in connection with the accompanying drawings, in which:

FIG. 1 is an illustration of an embodiment of the method of fabricating the auxetic foam sensors (ALS), in accordance with an embodiment of the present invention.

FIG. 2A is a scanning electron micrograph of CNT-coated auxetic foam at low magnification, after the fabrication in FIG. 1.

FIG. 2B is a scanning electron micrograph of CNT-coated auxetic foam at high magnification, after the fabrication in FIG. 1.

FIG. 3A is a schematic of the measuring technique for measuring the resistance of the AFS sensor in accordance with an embodiment of the present invention.

FIG. 3B is a schematic of the AFS sensor wherein measurements are made in the transverse direction and the longitudinal direction, in accordance with an embodiment of the present invention.

FIG. 7A illustrates the application of the AFS in a helmet for measuring impact pressure in real-time, wherein measured sensor performances under different forces, in a span of ~120 seconds, in accordance with an embodiment of the present invention.

FIG. 7B illustrates a real-time signal pattern of resistance change ratio as a function of time for monitoring the muscle movement during speech using the AFS, in accordance with an embodiment of the present invention.

FIG. 7C illustrates the measurement of the physical force of a heartbeat under normal (76 beats per minute) using the AFS, in accordance with an embodiment of the present invention.

FIG. 7D illustrates the signal of the AFS foam sensor when monitoring the finger motion to recognize different gestures, in accordance with an embodiment of the present invention.

FIG. 7E illustrates an example of the finger touch with pressure using the AFS, in accordance with an embodiment of the present invention.

FIG. 7F illustrates a schematic diagram of a sensor array (25×25), in accordance with an embodiment of the present invention.

FIG. 7G is a magnified view of the sensor array of FIG. 7F, corresponding to a highlighted region, in accordance with an embodiment of the present invention.

FIG. 7H is an optical photograph of a fabricated sensor array containing 25×25 pixels with a size of 30×30 cm$^2$, in accordance with an embodiment of the present invention.

FIG. 7I is a circuit schematic of the sensor matrix of FIG. 7F.

FIG. 7J is a measured right foot pressure pattern at normal standing, using the AFS in accordance with an embodiment of the present invention.

FIG. 7K is a measured right foot pressure pattern shifting weight to the inside of the foot using the AFS, in accordance with an embodiment of the present invention.

FIG. 7L is a measured right foot pressure pattern shifting weight to the outside of the foot, using the AFS in accordance with an embodiment of the present invention.

FIG. 7M is a measured right foot pressure pattern lifting heel off from ground, using the AFS in accordance with an embodiment of the present invention.

FIG. 7N is a measured right foot pressure pattern shifting weight into the heel, using the AFS in accordance with an embodiment of the present invention.

FIG. 7O illustrates that the static pressure is applied to the AFS matrix using human right foot, in accordance with an embodiment of the present invention.

DETAILED DESCRIPTION

Figure 4A:
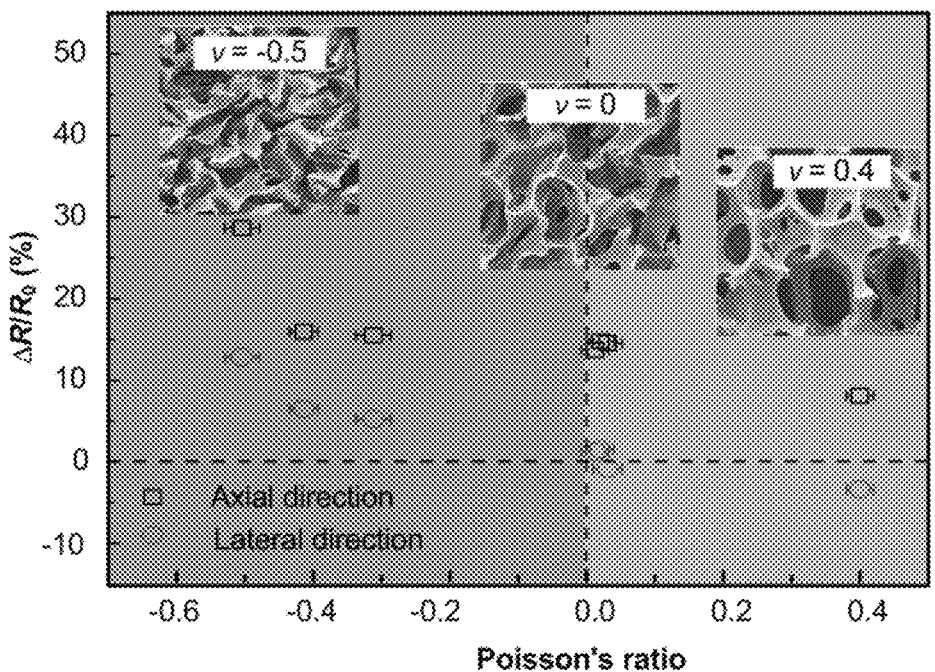
FIG. 4A is an illustration of the effect of Poisson's ratio on the resistive pressure response of the foams over both transverse and longitudinal directions under 10% tensile strain, in accordance with an embodiment of the present invention.

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

The present invention provides a cost-effective and scalable manufacturing process for a new class of porous materials as 3D flexible and stretchable piezoresistive sensors, by assembling carbon nanotubes onto porous substrates of tunable Poisson ratios. The piezoresistive sensitivity of the sensors of the present invention increases as the substrate's Poisson's ration decreases. Substrates with negative Poisson ratios (auxetic foams) exhibit significantly higher piezoresistive sensitivity, resulting from the coherent mode of deformation of the auxetic foam sensor (AFS) and enhanced tunneling resistance of the carbon nanotube networks. Compared with conventional foam sensors (CFS), the AFS with a Poisson's ratio of −0.5 demonstrates a 300% improvement in piezoresistive sensitivity and the gauge factor increases as much as 500%.

In addition to the nanomaterials, which are the active sensing elements of the sensor, the properties of the flexible substrates themselves also play a key role in determining the overall sensor performance. Prior art studies on the effects of the substrates focus on the Young's modulus or elastic modulus, and it has been suggested that porous substrates with reduced elastic modulus result in increased sensing properties. Yet, from the classical mechanics point of view, the other most fundamental property that dictates the elastic properties is the Poisson ratio, which is defined as the ratio of the lateral contractile strain to the longitudinal tensile strain for a material undergoing tension in the longitudinal direction. Collectively, they define the elastic properties and deformation characteristics of the materials in a three dimensional space. Conceivably, the Poisson ratio would impact the sensing performance of piezoresistive sensors; however, this effect has not been studied. Classical mechanics predicts that for isotropic materials, the Poisson ratio lies between −1 and 0.5, a fairly small range. With a few exceptions such as α-cristobalite, certain cubic metal and few biological tissues, the range of Poisson ratio of almost all natural or synthetic materials is even smaller, typically 0.3-0.5.

The performance of flexible and stretchable sensors relies on the optimization of both the flexible substrate and the sensing element, and their synergistic interactions. Herein, a novel strategy for cost-effective and scalable manufacturing of a new class of porous materials as 3D flexible and stretchable piezoresistive sensors, by assembling carbon nanotubes onto porous substrates of tunable Poisson ratios. It is shown that the piezoresistive sensitivity of the sensors increases as the substrate's Poisson's ratio decreases. Substrates with negative Poisson ratios (auxetic foams) exhibit significantly higher piezoresistive sensitivity, resulting from the coherent mode of deformation of the auxetic foam and enhanced changes of tunneling resistance of the carbon nanotube networks. The AFS has high sensing capability, is extremely robust, and capable of multimodal sensing, such as large deformation sensing, pressure sensing, shear/torsion sensing and underwater sensing. AFS shows great potential for a broad range of wearable and portable devices applications, which are described by reporting on a series of demonstrations.

A novel strategy is provided to fabricate piezoresistive sensors using the auxetic foam with tunable Poisson ratio as the substrate, and the investigation of their effects on the piezoresistive properties. The auxetic foam sensor (AFS) of the present invention is fabricated by assembling a thin layer of carbon nanotubes onto the surface of the porous microstructures via a facile and scalable dip-coating process. The piezoresistive sensing performance of the AFS was studied in response to a variety of deformation modes and environmental conditions. The results show that AFS is a new class of piezoresistive materials that is intrinsically stretchable and flexible. It is further demonstrated that the AFS has board sensing capabilities for potential applications in smart wearables, protective equipment, point-of care diagnostics devices, human-machine and pressure mapping interfaces.

In accordance with the method of the present invention for manufacturing negative Poisson ratio piezoelectric sensors, an aqueous dispersion of carbon nanotubes (CNTs) is first prepared, followed by the coating of the CNTs onto the auxetic foam utilizing a dipping-drying process.

With reference to FIG. 1, in an exemplary embodiment, an aqueous dispersion of multiwall carbon nanotubes (MWCNT) may be prepared by suspending, 200 mg MWCNT in 200 ml of deionized water with 5 ml of nonionic surfactant triton X-100. Then, the suspension is sonicated in an ice bath that is pulsed for 10 sec on/10 sec off, for up to 30 min. The length and diameter of dispersed CNTs in the resulting dispersion can be characterized as being 5 nm in diameter and 2 μm in length using an ultracentrifuge method. Atomic Force Microscopy (AFM) observation may be performed in tapping mode to directly examine the size of the dispersed CNTs. The AFM samples may be prepared by spin coating cleaned Si wafers with 25 μL CNT dispersion at 1000 rpm using a spin coater.

Following the preparation of the aqueous dispersion of MWCNTs, the CNT coated auxetic foams are achieved by a dipping-drying process. In accordance with this exemplary embodiment, the auxetic foams are first dipped into the CNT dispersion for 30 min, removed and dried in vacuum at 70° C. Then, the resulting coated auxetic foam is immersed in deionized water for 2 h to remove the residual Triton X-100 molecules, Finally, the CNT coated auxetic foam is dried in vacuum at 70° C., overnight.

In a particular embodiment, a large size auxetic foam sheet (30 cm×30 cm×0.7 cm) may be prepared via a vacuum-bagging method. For the CNT coating of the large size auxetic foam sheet, the above-described dipping-drying approach works very well and no additional process steps being required.

In the exemplary embodiment, morphologies of the CNT coated foams can examined by scanning electron microscopy (SEM) and the Raman spectra may be collected using 785 nm excitation at a laser power of 0.5 mW with a 50× objective lens. In the exemplary embodiment, the mass uptake of CNT was measured which resulted in a CNT coating weight being constant at ~1%.

To evaluate the sensitivity of the sensor, the real-time electrical properties of the auxetic foam piezoresistive sensor under various mechanical deformations can be measured by a two point probe method using a computer controlled electrometer. To perform the sensitivity evaluation of the sensor, two thin copper-wires are attached to the two end-sides of the CNT coated auxetic foam sensors with silver paste to connect the sensor to the electrometer. After testing, samples are inspected to ensure no sliding of the wire or cracking of the paste occurred during the test. The stretching and compression tests may be performed using a micro test frame with a 500N load cell. The shear tests maybe carried out on a rheometer with 25 mm parallel plate fixture.

Following the above exemplary manufacturing process, auxetic foams and convention foams with different Poisson ratios ν (including ν=0) may be prepared by placing the CNTs in a suspension 100, preparing an aqueous dispersion of MWCNTS 105, dip-coating using the carbon nanotube (CNT) suspension 110 and drying the dip-coated auxetic foam 115 to provide the auxetic piezoresistive sensor, as shown in FIG. 1 Note that to achieve uniform CNT deposition for high sensing performance, it is critically important to use a suspension with high-quality CNT dispersion, which has been verified qualitatively by direct AFM observations and quantitative analysis using the preparative ultracentrifuge method. The CNT coated foams are then immersed in deionized water for 2 hours to remove the residual surfactant, after which they are dried overnight in vacuum at 70° C. The CNT contents are determined by thermogravimetric analyses (TGA) to be ~1 wt % of the total sample weight for all foams. FIG. 2A and FIG. 2B illustrate the CNT-coated auxetic foam under inspection using a scanning electron microscope (SEM). FIG. 2A illustrates the low magnification SEM showing the typical re-entrant wall structure in the CNT-coated auxetic foam. FIG. 2B illustrates an enlarged view showing a very homogenous CNT layer on the surface of the cell wall. The CNT coated foam manufacturing process of the present invention can easily be scaled, resulting in the ability to fabricate auxetic foam sensors with different geometries and sizes as large as 900 cm².

To study the effects of the Poisson ratio ν on the piezoresistive sensitivity of the foam sensors, the experimental setup shown in FIG. 3 may be utilized. In the experimental setup, the loading machine 300 controls the stretch/compression profile, the video system 305 measures the displacements of the foam sensors 330 placed in the loading machine 300, and the two electrometers 310, 315 simultaneously measure the changes in electrical resistance in both the longitudinal (L) 325 and transverse (T) 320 directions.

Figure 4B:
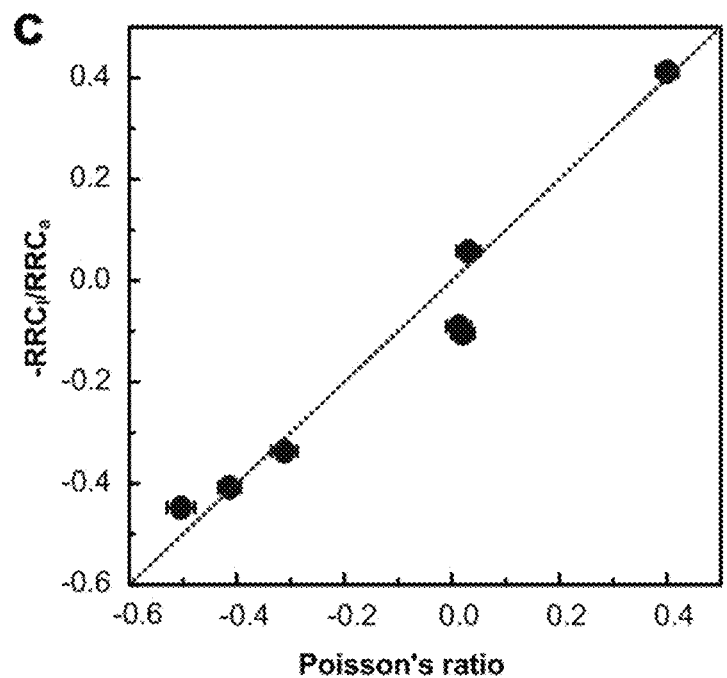
FIG. 4B is an illustration of the negative ratio of relative resistance changes in the transverse direction and longitudinal direction, versus the measured Poisson's ratio, in accordance with an embodiment of the present invention.

FIG. 4A illustrates the relative resistance change (AR) in longitudinal-direction ($RRC_L$) under 10% tension strain, calculated by the relation $RRC_L=\Delta R_L/R_{0L}$, where $\Delta R_L$ denotes the axial-directional resistance change and $R_{0L}$ denotes the axial-directional resistance at the initial state. As shown, the sensitivity of the sensors increased considerably as the Poisson's ratio decreased. For example, the AFS with a negative Poisson's ratio of −0.5 (v=−0.5) showed an increase of the piezoresistive sensitivity by 300% compared to the conventional foam sensor (CFS) with a positive Poisson's ratio of 0.4 (v=0.4). Analyses may also be performed for the relative resistance change in the transverse-direction ($RRC_T$). As illustrated, the sign of $RRC_T$ (positive or negative) differed between AFS (with negative v) and CFS (with positive v). By calculating the negative ratio of lateral relative resistance change to axial relative resistance change ($-RRC_T/RRC_L$), it is possible to estimate the value of v for each sample. FIG. 4B shows the plotted results, which are in excellent agreement with the values obtained by image analysis.

Figure 5A:
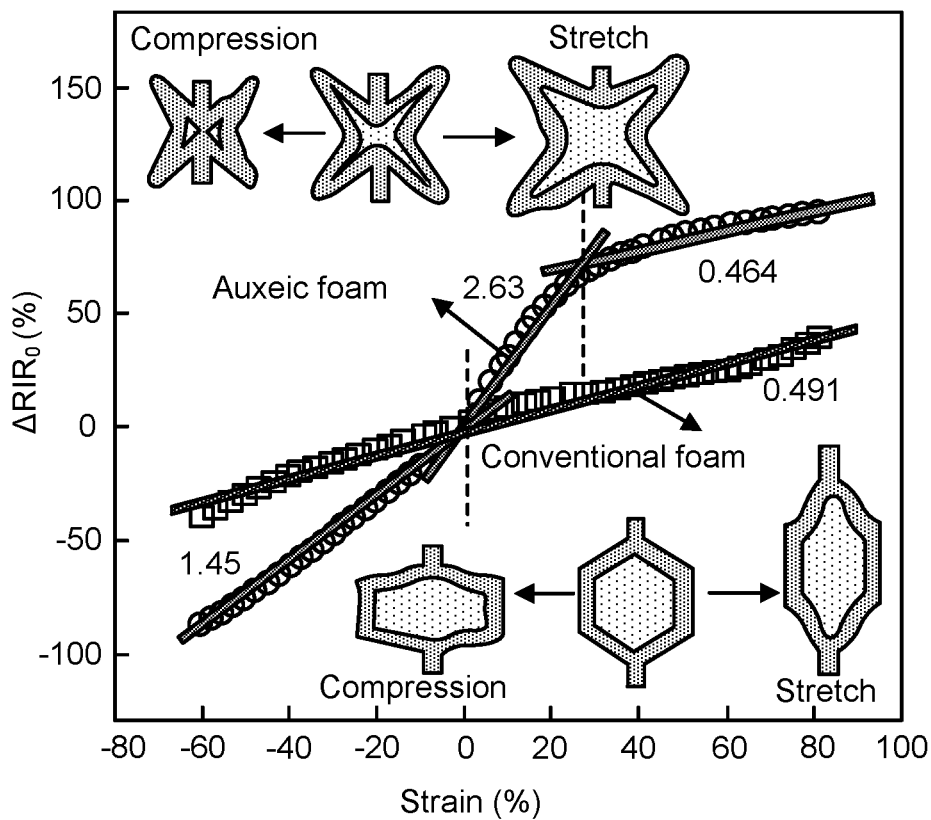
FIG. 5A is an illustration of the variation of relative resistance change with respect to both tensile and compressive strain for conventional foam sensors ($v=0.4$) and auxetic foam sensor ($v=-0.5$), wherein the four straight lines correspond to the plotted data fitted by linear equation, in accordance with an embodiment of the present invention.

To further investigate the effects of v on sensing performance, the relative resistance change in axial direction against the applied strain for both CFS and AFS may be plotted, as illustrated in FIG. 5A. Unless otherwise noted, the discussions below are for AFS with a v of −0.5. The behavior of the CFS can be adequately described by a linear response ($R^2$=0.98) under the entire strain range with a constant gauge factor (GF) of 0.49. By comparison, the AFS of the present invention shows distinct behaviors in three strain regimes (one in compression and two in tension), and exhibits a significantly better sensing response over a broad range of strains. The compressive GF was 1.45, almost three times (300%) that of the GF for CFS. The performance was even better for tensile GF (2.63), which was more than 5 times (500%) greater, albeit within a moderate strain of 30%. The sensing performance exhibits an abrupt change at the tensile strain of ~30%, beyond which the GF of the AFS decreases to ~0.464, comparable to that of CFS.

The significantly higher piezoresistive sensitivity of the AFS of the present invention can be understood from the standpoint of enhanced strain sensitivity of the tunneling-effect caused by the unique deformation characteristics of auxetic foams in the three dimensional space. When the sensor is under tension (compression), its resistance would increase (decrease) due to the enlarged (reduced) separation and the correspondingly increased (decreased) tunneling resistance between the neighboring CNTs. In AFS, the same type (or mode) of deformation always occurred in all three dimensions (both the applied stress direction and the transverse direction). This coherent deformation leads to superimposed and amplified increase (decrease) of the tunneling resistance under tension (compression). In contrast, for CFS with a positive Poisson's ratio, the mode of deformation of the transverse direction is always the opposite of that of the imposed stress direction. Consequently, when the tunnel resistance increases (decreases) under tension (compression) in the applied stress direction, it decreases (increase) in the transverse direction. This destructive effect diminishes the overall change of tunneling resistance and results in inferior piezoresistive sensitivity. FIG. 5A schematically illustrates the different behavior between AFS and CFS. The mechanism is also supported by the experimentally measured change of resistance (under tension) in the longitudinal and transverse directions for AFS and CFS as shown in FIG. 3B. For AFS the resistances in both directions increased, whereas for CFS the resistance in the transverse direction decreased along with the increase of the resistance in the stress direction. The different sensitivity of the AFS in compression and tension modes may be related to the difference in the microscopic deformation of the cellular structure under the same nominal strain, which depends on the initial re-entrant structure and the modes of deformation they may experience, Under a large tensile strain the re-entrant structure may deteriorate (flatten) and eventually disappear, and the morphology will resume to that of the conventional foam. This may be the reason that the GE of the AFS under large tensile strain approaches to that of CFS. Nevertheless, the AFS of the present invention demonstrated superior sensing performance over a broad range of strain under both tension and compression. Aside from the Poisson's ratio discussed herein, slight difference in the cell morphology, e.g., pore size and overall porosity of the sensing foams, may also play a role in the sensing performance. Higher porosity and larger pore size would presumably result in larger deformation under the same stress. In addition, the size of pores can also influence the deformation of CNT pathways because CNT layers were coated on the surface of the foams.

Figure 5B:
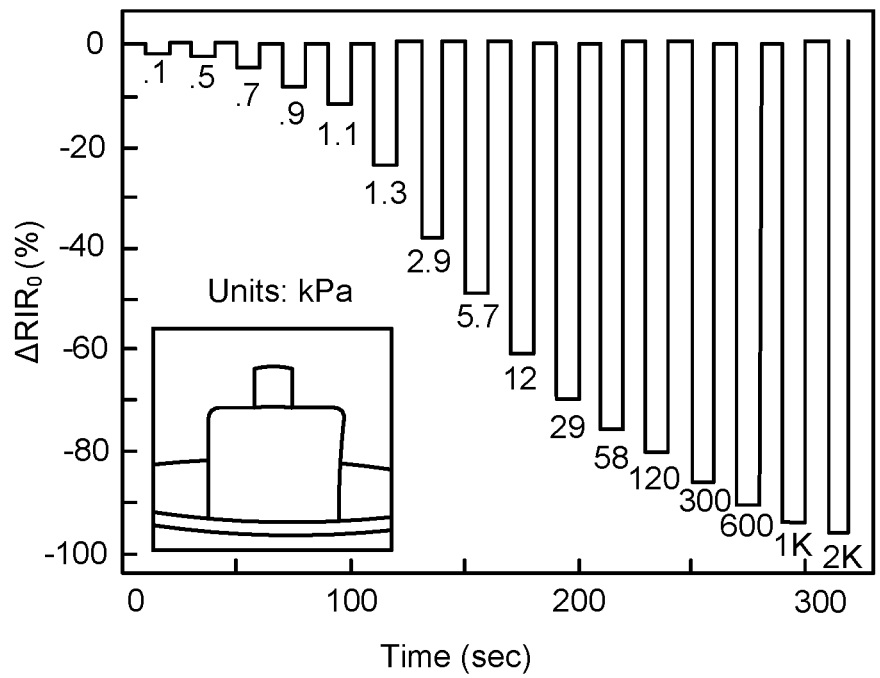
FIG. 5B is an illustration of the static pressure sensing test results, wherein a series of increasing weights are placed on an auxetic foam sensor, in accordance with an embodiment of the present invention. The numbers in the figure show the weight (in grams) place on the auxetic foam. The inserted picture depicts that a 100 g weight is placed on an auxetic foam sensor, in accordance with an embodiment of the present invention.

To reassure the superior sensitivity, a series of static pressure sensing tests are performed to validate the high sensitivity and reliability of AFS for capturing a wide range of pressures. As shown in FIG. 5B, a series of standard weights from 100 mg to 2 kg were individually placed on top of a cuboid-shaped AFS sample (length: 15 mm, width: 14.5 mm, height: 8.5 mm). Each time a greater weight was added, it was shown that the signal instantly jumped to a higher level (response time<100 ms) and remained stable. As soon as the weight was removed the signal returned to the baseline. As a consequence, the amplitude of the sensing signal consistently registered with the level of the pressure applied on the sensor. Moreover, the sensed pressure is shown to cover an extremely wide range (more than 4 orders of magnitude) from subtle-pressure regime (1 Pa-1 kPa), low-pressure regime (1-10 kPa), medium-pressure regime (10-100 kPa) to high-pressure regime (>100 kPa). Such a wide range of sensing capabilities makes the auxetic foam sensors of the present invention excellent for applications such as structure health monitoring of aircraft and automobile structures, which usually undergoing a large range of load spectrums during service.

Figure 6A:
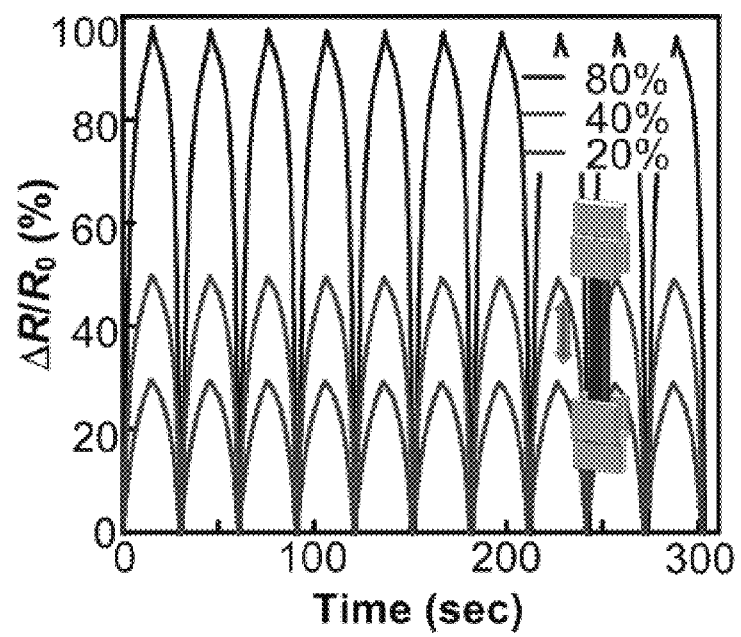
FIG. 6A is a graphical illustration of the resistance response of the AFS to tensile strain, in accordance with an embodiment of the present invention.
Figure 6B:
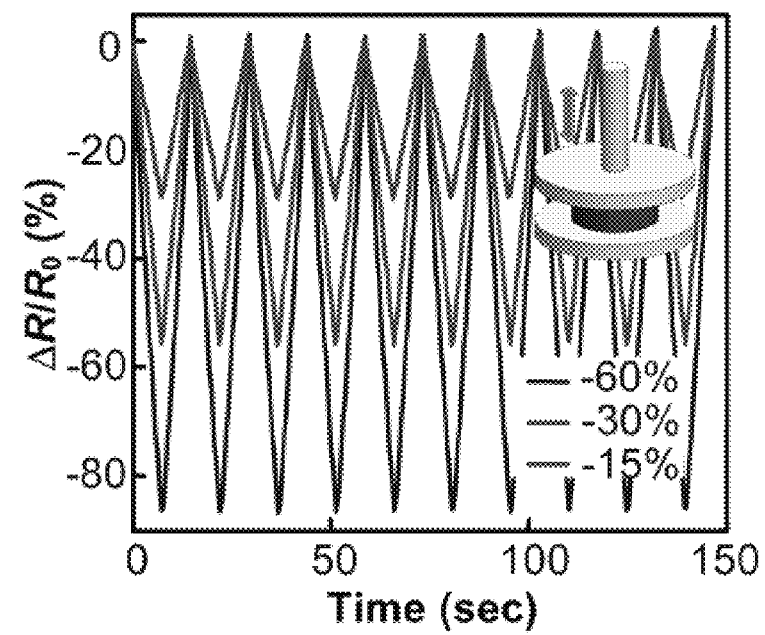
FIG. 6B is a graphical illustration of the resistance response of the AFS to compressive strain, in accordance with an embodiment of the present invention.
Figure 6C:
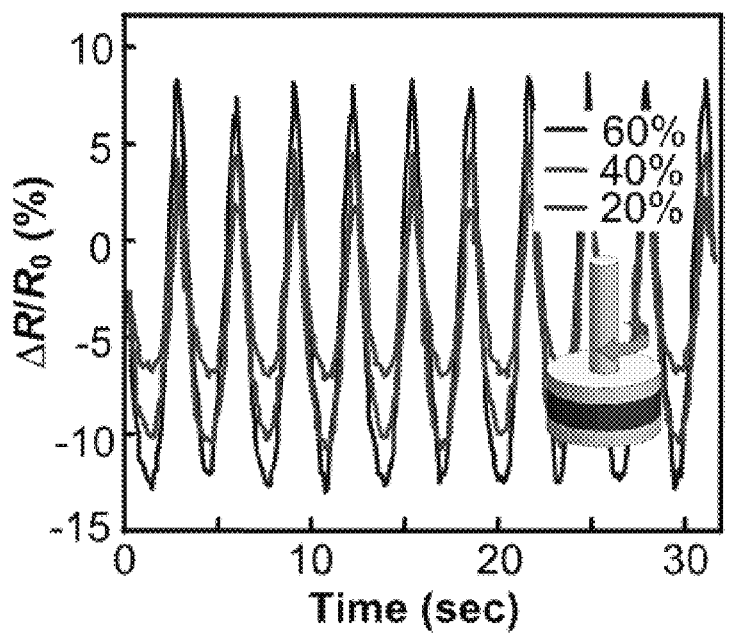
FIG. 6C is a graphical illustration of the resistance response of the AFS to shear strain during time sweep test at 0.16 Hz frequency when deformed by different levels of shear strain, in accordance with an embodiment of the present invention.
Figure 6D:
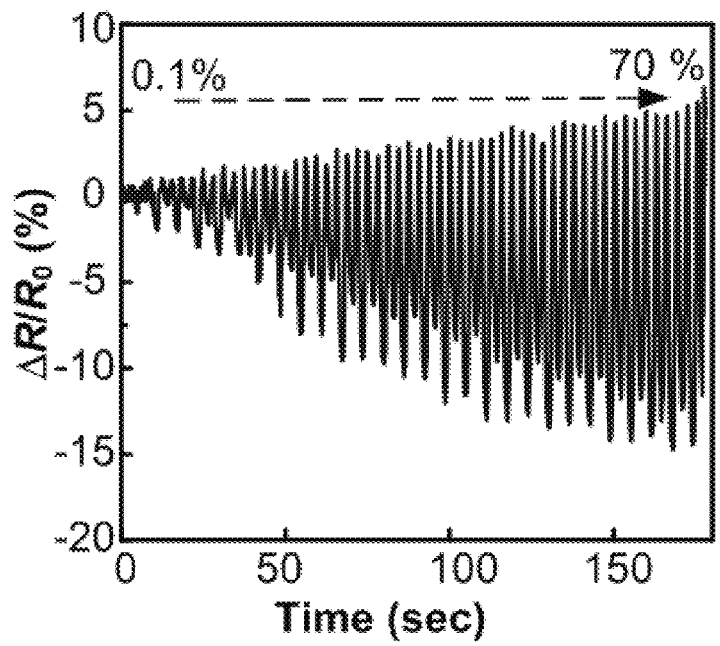
FIG. 6D is a graphical illustration of the resistance response of the AFS during shear strain sweep test at 0.16 Hz frequency, in accordance with an embodiment of the present invention.
Figure 6E:
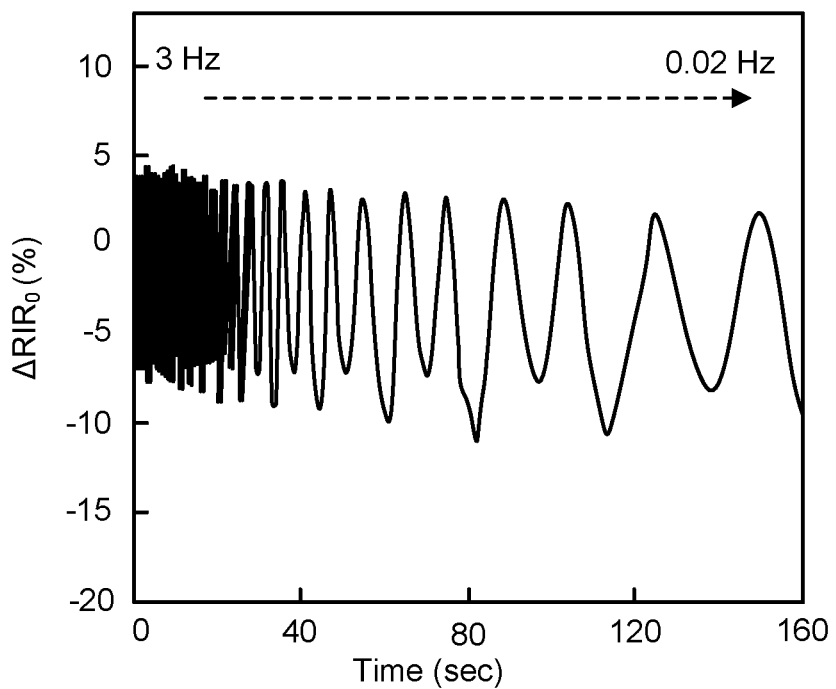
FIG. 6E is a graphical illustration of the resistance response of the AFS during shear frequency sweep test between 0.02 and 3 Hz under 30% strain, in accordance with an embodiment of the present invention.

Multimodal sensing capabilities of the AFS, including tension, compression, and shear/torsion sensing, are enabled by the flexible and stretchable nature and the unique auxetic characteristics of the AFS. Coupled electrical-cyclic tension/compression tests may be performed on the AFS to evaluate the piezoresistive response of the AFS when it is subjected to a wide range of mechanical strains. As representative examples, FIG. 6A and FIG. 6B, respectively, show the resistance responses when the sensors are deformed by different levels of tensile or compressive strains. For all sensors, the resistance change is in phase with the cyclic deformation stimulations—i.e., when the strain increased/decreased, the sensor resistance accordingly increased/decreased. Dynamic shear tests are then performed to examine the resistance response of the AFS under various dynamic shear loading. Time sweep measurements at 0.16 Hz frequency confirmed the stability of the output signal under various shear strains, as shown in FIG. 6C. The strain sweep at 0.16 Hz frequency demonstrated a clear dependence of sensing performance of the AFS on shear strain from 1% to 70%, as shown in FIG. 6D. Also, the resistance response of AFS tested under various frequencies ranges from 0.02 to 3 Hz under 30% shear strain is shown in FIG. 6E. In these exemplary embodiments, the output signal remained approximately constant during the frequency sweep, indicating a wide dynamic sensing range of AFS.

Figure 6F:
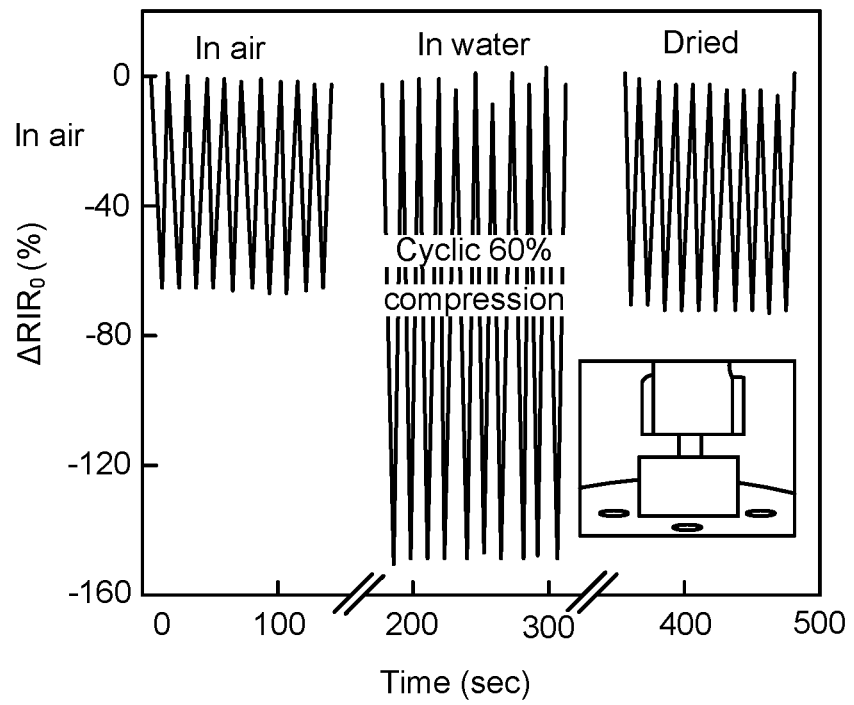
FIG. 6F is a graphical illustration of the resistance response of the AES to cyclic compression loading under various environment conditions, following a sequence of air, water, air, in accordance with an embodiment of the present invention. The inserted picture show the test setup.
Figure 6G:
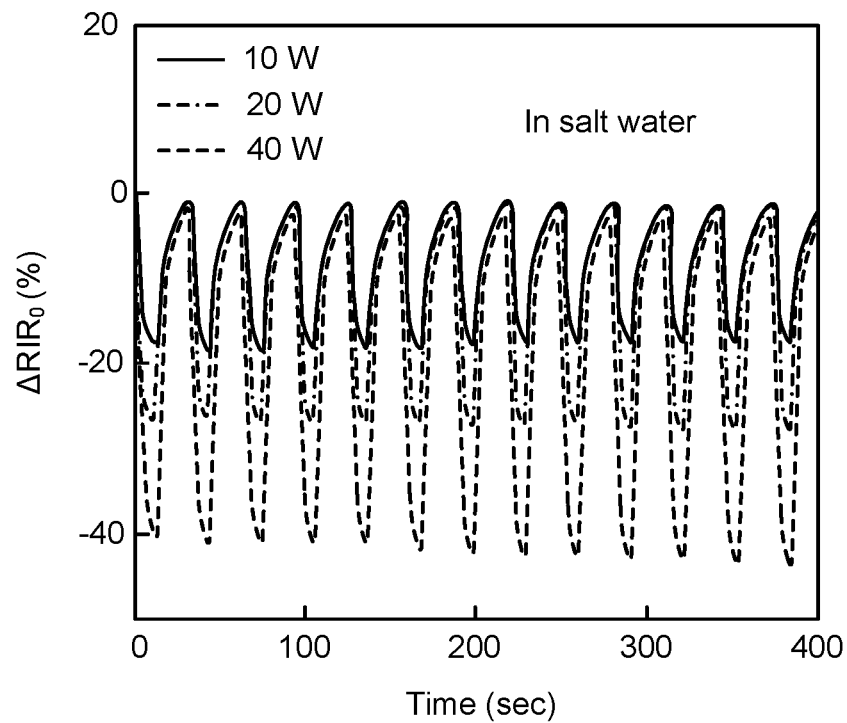
FIG. 6G is a graphical illustration of the resistance response of the AFS to ultrasound acoustic wave in artificial seawater (an aqueous 3.5 wt % sodium chloride solution), in accordance with an embodiment of the present invention.
Figure 6H:
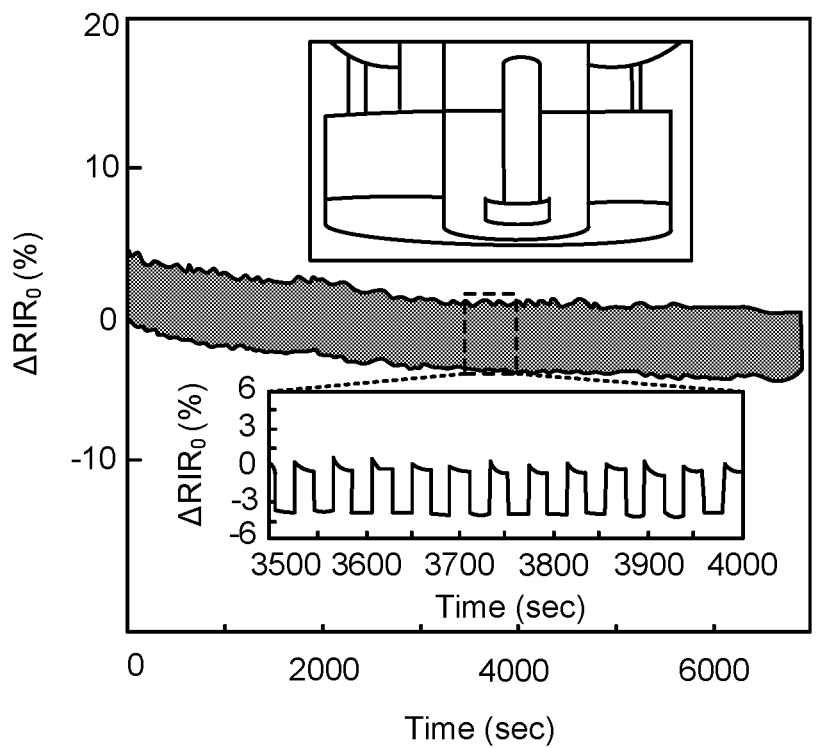
FIG. 6H illustrates the underwater durability test of the AFS during tube sonication in an ice bath on pulse mode (10 s on/10 s off) for up to 7000 s, in accordance with an embodiment of the present invention. The top inserted picture shows the test setup. The bottom inserted picture show the sensor response in a section of the testing period.

To investigate the effects of environment on the sensor performance, the measurements of resistance under cyclic compression loading may be conducted in various environments, including air and water, as shown in FIG. 6F. The sample is tested in air and then 20° C. de-ionized water is filled in the test chamber. Interestingly, the sensitivity in water is found to be approximately two fold-higher than that in air. This observation can be understood by considering how the adsorbed water moves with strain. Initially, adsorbed water in the AFS acts as a spacer that keeps the adjacent cell walls apart. When the AFS is compressed, the adsorbed water is squeezed out, resulting in a massive increase in the contact area and a larger decrease in resistance. After removing the water, the sensor recovered to its original sensitivity. The performance of the AFS can also be examined in saline water (an aqueous solution with 3.5 wt % sodium chloride). FIG. 6G shows the measured resistance response of the AFS to a pulsed-ultrasound acoustic wave (10 sec on/10 sec off) generated at different powers. These plots illustrate a very good signal-to noise (S/N) ratio in contrast to that in water, as illustrated with reference to FIG. 6H.

Figure 6I:
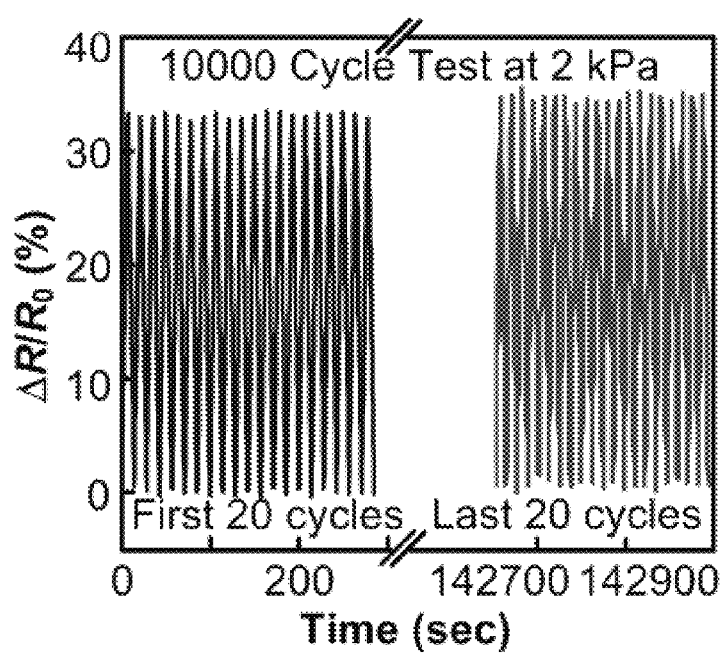
FIG. 6I illustrates the durability of the AFS by comparing the resistance response for the first 20 cycles and last 50 cycles of a 10,000-cycle test at 2 kPa, in accordance with an embodiment of the present invention.

In addition to the multimodal and wide range of sensing capability, high stability and environmental responsiveness, durability of the sensor is another key parameter for assessing the sensor quality. Durability tests may be performed by applying a 10,000 cycle compression test with the maximum loading pressure of 2 kPa, as shown in FIG. 6I, wherein the cyclic frequency is 0.07 Hz. In this experiment, the difference is indiscernible in the real time resistance response from the first 20 cycle and the last 50 cycles and the AFS sensor maintained its initial performance property after 10,000 cycle test.

Because of its multimodal capability, stretchability, water repellence, lightweight and high sensitivity, the AFS of the present invention is well suited for wearable applications. The potential applications of AFS through a series of demonstrations to illustrate potential areas on the body where the AFS can be worn are demonstrated with referenced to FIG. 7A-FIG. 7O. FIG. 7A illustrates a smart helmet with intrinsic sensing capabilities, by replacing the foam pads in the current helmet design with the auxetic sensing foams of the present invention to capture the impact event. Such sensing foam pads are capable of multi-zone, multi-point measurements for typical impacts occurring to different parts of the head, including front, back, top, and sides, detecting their precise location, magnitude, duration, and frequency. For testing of the foam sensing performance an impact tester was used to repeatedly strike the top of the helmet at increasingly higher forces at a frequency of 0.5 Hz. As FIG. 7A shows, the foam sensors performed well by dependably detecting the timing, frequency, and magnitude of the impact event and outputting signals in sharp spikes corresponding to the impact events. Such a system would be invaluable in detection of harmful impacts for prevention of injuries and indicating when timely treatment is required to prevent chronical, cumulative brain damage. Moreover, compared to existing foam pads, the auxetic sensing foam has significantly better energy absorbing capabilities to provide substantially better protection to the players from both direct impacts and rotational blows. Such a two-pronged solution is superior to any other existing solution to address this issue in terms of accuracy, versatility, simplicity, cost, and ease of implementation and use.

In addition, the auxetic foam sensors may also be used in wearable biosignal-measuring devices. As shown in FIG. 7B, a foam sensor may be attached onto a person's neck to monitor the muscle movement during speech. When the simple words "go" were repeated, signals were produced which timing and pattern corresponded well with the vocal events. As a further example, the AFS may be successfully used to monitor the wrist pulse as shown in FIG. 7C, wherein a typical pulse waveform was detected and the pulse frequency of 76 beats/min was obtained. The AFS can be used for many additional body-monitoring applications, such as monitoring the rehabilitation progress of a patient, wound healing, respiratory condition, and heart rate detection. It can also be used for monitoring the muscle, breath, and fatigue condition of an athlete during training to reduce injuries and boost performance These auxetic foam sensors of the present invention can potentially be used in the field of human-machine interfaces. For example, attaching the AFS directly to the fingertip can serve as a means to transfer the human intentions of pressing buttons and switches, as shown in FIG. 7D. FIG. 7E demonstrates that the AFS is wearable on the finger joint as a gesture control interface for human-machine interaction applications. The signal of the foam sensor dependably registers the finger motion to recognize different gestures. The gestures can be converted to different commands to control various electronic devices or robots. For example, a user wearing the sensor can make phone calls, write emails, play games, and adjust music volume using only a finger or body movement. For mechanical engineers, this invention has a potential for remotely controlling robots working in harsh and dangerous situations, such as bomb disposal and deep sea exploration.

Finally, to demonstrate the ability of the auxetic piezoresistive sensor in measuring the pressure distribution, a 25×25 sensor array fabricated over a total area of 30×30 cm$^2$ is provided. FIG. 7F and FIG. 7G show a schematic and a photograph of the sensor matrix, respectively. FIG. 7H illustrates the sensing system and a simplified electrical schematic that scans the intersecting points of the sensor's rows and columns and measure the resistance at each crossing point. The experimental results reported here illustrate the application of the AFS matrix in plantar pressure distribution analysis, which is an essential evaluation tool widely used in many fields ranging from sports performance and injury prevention to prosthetics and orthotics design. As shown in FIG. 7J to FIG. 7N, the colored contour maps clearly display the various barefoot pressure distribution applied by a human right foot, shown in FIG. 7O, at five various gait phases (neutral position, pronation, supination, plantarflexion and dorsiflexion). By additional shaping, this AFS matrix can also be inserted into shoes for in-shoe plantar pressure measurement. It is anticipated that the presented technical platform may find a wide range of application in measuring body pressure distribution, adjusting sitting posture, or monitoring muscle movements.

The present invention provides a new class of auxetic foam-based piezoresistive sensors having numerous potential applications. The results show that the negative Poisson ratio of the substrate leads to significant improvement of the piezoresistive sensitivity and gauge factor of the sensor. This is the result of the coherent deformation in all three dimensions resulting from the re-entrant cellular structure of the auxetic foams, which in turn results in the amplification of the change of piezoresistive properties of CNT conductive network coated on the auxetic foam cell surface. The AFS of the present invention possesses multi modal and wide range of sensing capabilities.

Compared to conventional sensors, the auxetic behavior of the AFS, i.e., expansion in the transverse direction when stretched, provides a unique advantage and is particularly beneficial in stretchable sensors and devices. In addition, due to the negative Poisson ratio, when bent, the auxetic foam form doubly curved or domed shapes due to their synclastic curvature properties. This unique shape conforming capability, which is not possible in non-auxetic materials, is particularly advantageous and beneficial in a wide variety of applications in wearable sensing equipment, considering the complexity of the human body contours, which often include various double curvature surfaces (e.g., head and shoulder). Also, such equipment can more comfortably fit the shape change of a body's flexible zones (e.g., elbow and knee) to satisfy the dynamic needs of humans and provide a more accurate means for motion monitoring. Moreover, the combination of protecting and sensing function in such sensor foams should find important applications in the smart protective equipment, such as helmet, bullet-proof vests, or kneepads.

Potential underwater applications of the auxetic foam sensors have also been described. Excellent sensitivity of auxetic foam sensors are presented in both deionized water and salt water. Considering its open-cell structure, which could permit a pressure equilibration to the external pressure reference, such sensors can theoretically be operated at an arbitrary water depth.

Furthermore, from the classic mechanics point of view, the elastic properties of isotropic materials are defined by the quartet of elastic constants: Young's modulus (E), shear modulus (G), and bulk modulus (K), and the Poisson ratio (v). The three moduli are the measures of stiffness, rigidity, and compressibility of a material. They are related through Poisson ratio via the following equations:

$$G = \frac{E}{2(1 + v)} \quad (1)$$

$$K = \frac{E}{3(1 - 2v)} \quad (2)$$

Therefore, by gaining the capability to tune the Poisson's ratio, it is possible to further expand the range of mechanical characteristics that can be realized in the auxetic substrates. This may offer opportunity to the development of new flexible and stretchable sensors with unique electromechanical performance that is not possible today. As such, the AFS of the present invention exhibits high sensing capability, is extremely robust and capable of multimodal sensing, such as large deformation sensing, pressure sensing, shear/torsion sensing and underwater sensing. The AFS shows great potential for a broad range of wearable and portable device applications.

What is claimed is:

1. An auxetic foam sensor comprising:
   a porous substrate having a tunable negative Poisson ratio, wherein the porous substrate comprises auxetic foam; and
   a piezoresistive layer covering at least a portion of the porous substrate, wherein the piezoresistive sensitivity of the auxetic foam sensor increases as the Poisson ratio of the porous substrate decreases, wherein the gauge factor (GF) of the auxetic foam sensor under tensile strain relative to under compressive strain is variable by tuning the Poisson ratio to provide superimposed and amplified tunneling resistance, wherein the superimposed and amplified tunneling resistance comprises an increase of tunneling resistance in both the transverse direction and in the stress direction when under tension, and a decrease of tunneling resistance in both the transverse direction and in the stress direction when under compression, wherein the GF of the auxetic foam sensor equals a first value when in a first tension region, and equals a second value when in a second tension region different than the first tension region, and equals a third value when under compression, wherein the first value, the second value, and the third value are different values.

2. The sensor of claim 1, wherein the Poisson ratio of the substrate is about −0.5.

3. The sensor of claim 1, wherein the piezoresistive layer comprises a conductive nanomaterial.

4. The sensor of claim 1, wherein the piezoresistive layer comprises carbon nanotubes.

5. The sensor of claim 1, wherein the piezoresistive layer is dip-coated onto the porous substrate.

6. The sensor of claim 1, wherein the piezoresistive layer is about wt 1% of the sensor.

7. The sensor of claim 1, wherein the GF of the sensor is higher under tensile strain than under compressive strain.

8. The sensor of claim 1, wherein the GF of the sensor is higher under compressive strain than under tensile strain.

9. A wearable device comprising:
   an auxetic foam sensor, the auxetic foam sensor comprising:
      a porous substrate having a tunable negative Poisson ratio, wherein the porous substrate comprises auxetic foam; and
      a piezoresistive layer covering at least a portion of the porous substrate, wherein the piezoresistive sensitivity of the auxetic foam sensor increases as the Poisson ratio of the porous substrate decreases, wherein the gauge factor (GF) of the auxetic foam sensor under tensile strain relative to under compressive strain is variable by tuning the Poisson ratio to provide superimposed and amplified tunneling resistance, wherein the superimposed and amplified tunneling resistance comprises an increase of tunneling resistance in both the transverse direction and in the stress direction when under tension, and a decrease of tunneling resistance in both the transverse direction and in the stress direction when under compression, wherein the GF of the auxetic foam sensor equals a first value when in a first tension region, and equals a second value when in a second tension region different than the first tension region, and equals a third value when under compression, wherein the first value, the second value, and the third value are different values.

10. The wearable device of claim 9, wherein the piezoresistive layer of the sensor comprises carbon nanotubes.

11. The wearable device of claim 9, wherein the wearable device is selected from a head protection device, a bio-sensing device, a gesture sensing device, a tactile sensing device and a pressure sensing device.

12. The wearable device of claim 9, wherein the GF of the sensor is higher under tensile strain than under compressive strain.

13. The wearable device of claim 9, wherein the GF of the sensor is higher under compressive strain than under tensile strain.

\* \* \* \* \*